(12) United States Patent
Hao et al.

(10) Patent No.: US 7,307,309 B2
(45) Date of Patent: Dec. 11, 2007

(54) EEPROM WITH ETCHED TUNNELING WINDOW

(75) Inventors: Pinghai Hao, Plano, TX (US); Jozef Mitros, Richardson, TX (US); Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 40 days.

(21) Appl. No.: 10/794,887

(22) Filed: Mar. 4, 2004

(65) Prior Publication Data

US 2005/0194631 A1 Sep. 8, 2005

(51) Int. Cl.
*H01L 29/788* (2006.01)
(52) U.S. Cl. .................. 257/317; 257/315; 257/330
(58) Field of Classification Search .......... 257/314, 257/315, 316, 317, 330; 438/593–594, 667
See application file for complete search history.

(56) References Cited

U.S. PATENT DOCUMENTS

| | | | |
|---|---|---|---|
| 5,172,200 A * | 12/1992 | Muragishi et al. .......... 257/315 |
| 5,736,765 A | 4/1998 | Oh et al. | |
| 5,854,501 A | 12/1998 | Kao | |
| 5,945,707 A * | 8/1999 | Bronner et al. ............. 257/330 |
| 6,121,655 A * | 9/2000 | Odanaka et al. ............ 257/344 |
| 6,303,959 B1 * | 10/2001 | Ratnam ..................... 257/314 |
| 6,317,360 B1 | 11/2001 | Kanamori | |
| 6,355,944 B1 * | 3/2002 | Alok .......................... 257/77 |
| 2002/0177269 A1 | 11/2002 | Chou | |
| 2004/0056300 A1 | 3/2004 | Choi et al. | |

* cited by examiner

*Primary Examiner*—Mary Wilczewski
*Assistant Examiner*—Tsz Chiu
(74) *Attorney, Agent, or Firm*—Rose Alyssa Keagy; W. James Brady; Frederick J. Telecky, Jr.

(57) ABSTRACT

A method forming a current path in a substrate (322) having a first conductivity type is disclosed. The method includes forming an impurity region (314) having a second conductivity type and extending from a face of the substrate to a first depth. A hole (305) is formed in the impurity region. A first dielectric layer (360-364) is formed on an inner surface of the hole. A first electrode (306) is formed in the hole adjacent the dielectric layer.

22 Claims, 4 Drawing Sheets

EEPROM WITH ETCHED TUNNELING WINDOW

FIELD OF THE INVENTION

This invention generally relates to electronic circuits, and more specifically to fabrication and structure of an EEPROM cell with an etched tunneling window.

BACKGROUND OF THE INVENTION

The continuing popularity of portable electronic devices presents manufacturers with significant challenges. Increasing capability of electronic devices is moderated by considerations of cost, size, weight, and battery life. These considerations have increasingly resulted in higher levels of semiconductor integration. Thus, portable electronic devices frequently embed volatile and nonvolatile memory, control, signal processors, and other circuit functions on a single integrated circuit. Further optimization of these portable electronic devices dictates even greater reduction in geometric feature sizes and spaces between these geometric features. Shrinking feature sizes require lower supply voltages to limit maximum electric fields. Even with lower supply voltages, however, special considerations are required for reliable device operation.

Referring to FIG. 1, there is an electrically erasable programmable read only memory (EEPROM) cell of the prior art. The EEPROM memory cell is preferably formed on a P-type substrate 122 between field oxide isolation regions 120. These field oxide isolation regions 120 are preferably formed by local oxidation of silicon (LOCOS) as is well known to those having ordinary skill in the art. The EEPROM memory cell includes N+ source 108 and drain 116 regions. Lightly doped drain (LDD) regions 109 are formed adjacent the N+ source 108 and drain 116 regions. An N+ tunnel implant region 114 is formed adjacent and in electrical contact with the N+ drain region 116. A gate oxide region 110 is formed over the source 108, drain 116, and tunnel implant region 116. The gate oxide region 110 is etched to form a thin tunnel oxide region 112. A first polycrystalline silicon floating gate 106 is formed over an active area between field oxide isolation regions 120. A control gate dielectric region is formed over the first polycrystalline silicon floating gate 106. A second polycrystalline silicon control gate 104 is formed over the control gate dielectric region. A sidewall dielectric 107 of preferably silicon nitride is formed adjacent the first polycrystalline silicon floating gate and the second polycrystalline silicon control gate 104. A conductive layer of preferably titanium silicide (not shown) is formed at the upper surface of the N+ source 108 and drain 116 regions and the polycrystalline silicon control gate 104. A dielectric region 118 is formed over the EEPROM memory cell. Contact holes are etched in the dielectric 118, and metal electrodes 100 and 102 are formed to provide electrical contact to respective source and drain terminals of the EEPROM memory cell.

In operation, the floating gate 106 stores a charge indicative of a logical one or zero. By convention, when the EEPROM cell is programmed to a logical one state, it stores a negative charge on floating gate 106. Alternatively, when the EEPROM cell is erased to a logical zero state, negative charge is removed from the floating gate 106. Both program and erase operations preferably transfer charge to and from the floating gate 106 by Fowler-Nordheim tunneling. During an erase operation, for example, a high voltage is applied to drain terminal 102, control gate 104 is connected to ground, and source terminal 100 floats in a high impedance state. The high positive voltage at terminal 102 is applied to N+ drain region 116 and N+ tunnel implant region 114. This high voltage produces a high electric field across the thin tunnel oxide 112 window, thereby imparting sufficient energy to permit negative charge to tunnel from floating gate 106 and through tunnel oxide window 112 to N+ tunnel implant region 114.

The thickness of tunnel window oxide 112, therefore, is critical to proper operation of the EEPROM memory cell in both program and erase modes. If tunnel window oxide 112 is too thin, long-term data retention may be degraded by excessive leakage. Alternatively, if tunnel window oxide 112 is too thick, insufficient charge may be removed during erase to produce a zero. Manufacturing the correct tunnel window oxide 112 thickness is greatly complicated by the presence of N+ tunnel implant region 114. N+ tunnel implant region 114 must have a sufficiently high surface concentration to prevent inversion at the interface with tunnel window oxide 112. This high concentration of N+ tunnel implant region 114, however, greatly enhances oxide growth. For example, a gate oxide recipe that produces 285 Å of gate oxide on a lightly doped P-type silicon wafer will result in a gate oxide thickness of about 325 Å if 2E14 atoms/cm$^2$ of N+ arsenic (As) is implanted at an energy of 80 KeV prior to gate oxidation. Gate oxide 10 is then etched from the tunnel window region 112. The tunnel oxide 112 is then regrown to a target thickness of 70 Å. Relatively small variations of the N+ region 114 implant dose, however, can produce large variations of 70 Å to 150 Å tunnel oxide 112 thickness. Thus, a method to reduce this critical variation of tunnel oxide 112 thickness in manufacturing and the corresponding variation of EEPROM memory cell program and erase operation is needed.

SUMMARY OF THE INVENTION

In accordance with a preferred embodiment of the invention, there is disclosed a method of forming a current path in a substrate having a first conductivity type. The method includes forming an impurity region having a second conductivity type and extending from a face of the substrate to a first depth. A hole is formed in the impurity region. A first dielectric layer is formed on an inner surface of the hole. A first electrode is formed in the hole adjacent the dielectric layer. The thickness of the first dielectric layer varies with the concentration of the impurity region.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
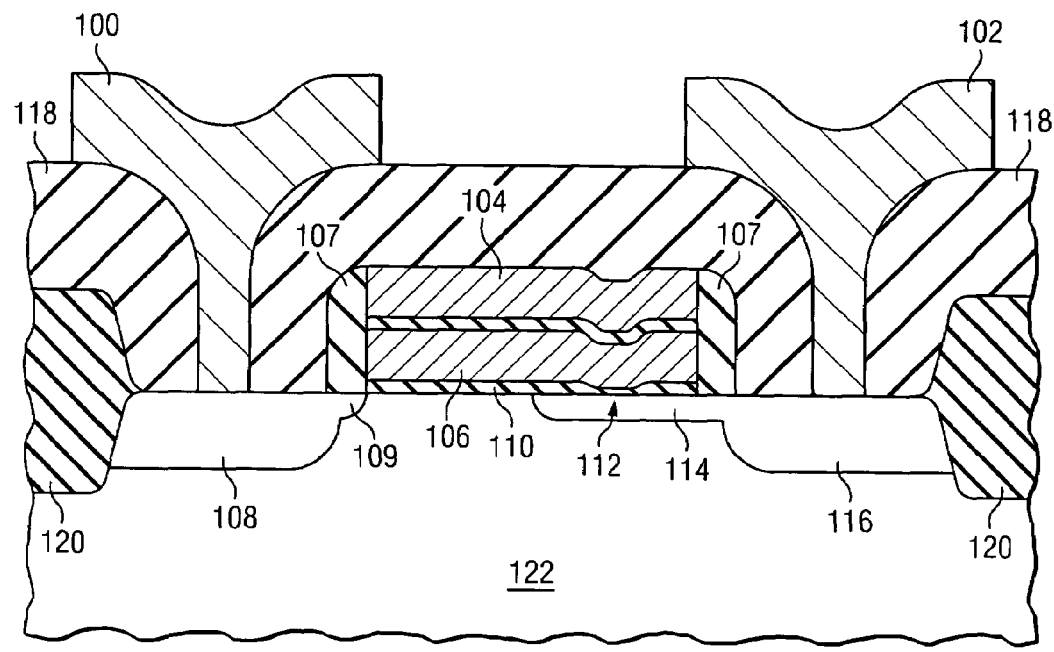
FIG. 1 is an EEPROM memory cell of the prior art.
Figure 2:
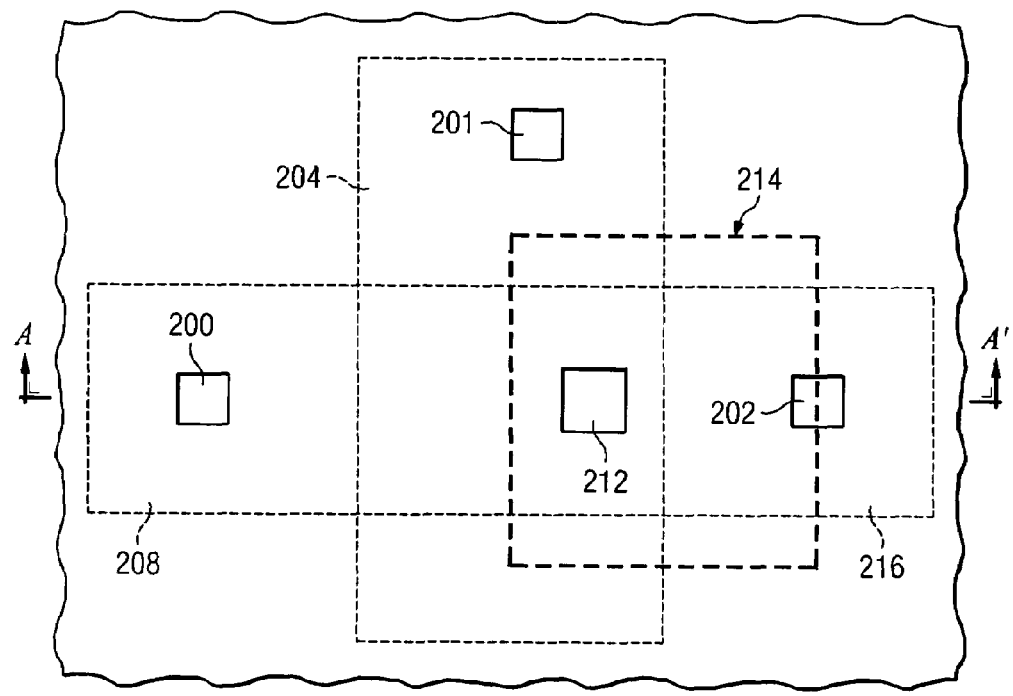
FIG. 2 is a layout diagram of an EEPROM memory cell of the present invention.

Referring to FIG. 2, there is a layout diagram of an electrically erasable programmable read only memory. The name is something of a misnomer, since data may be repeatedly read from and written to the memory cell. The memory cell is also referred to as a flash memory cell due to a relatively fast erase operation with Fowler-Nordheim tunneling. Flash or electrically erasable programmable read only memory cells are generally categorized as nonvolatile memory cells, since they retain their data state after power is removed. The memory cell is preferably formed on a P-type substrate and includes an N+ implant region 214 formed at the face of the substrate. The N+ implant region 214 is formed in the area indicated by the infill pattern and bounded by the dashed line. A hole 212 is formed in the face of the substrate within the N+ implant region 214. The side wall of the hole serves as a tunneling window for charging and discharging a floating first polycrystalline silicon gate. The floating first polycrystalline silicon gate is formed over the hole 212. A second polycrystalline silicon control gate 204 is formed over and coincident with the floating first polycrystalline silicon gate. The control gate 204 includes contact terminal 201. An N+ source region 208 and an N+ drain region 216 are formed at a face of the substrate. Both the source 208 and drain 216 regions are preferably formed by ion implantation after formation of the second polycrystalline silicon control gate 204. The source 208 and drain 216 regions and are, therefore, self-aligned with polycrystalline silicon control gate 204 and bounded as indicated by the infill pattern outside polycrystalline silicon control gate 204. The source 208 and drain 216 regions include respective contact terminals 200 and 202.

Referring now to FIGS. 3A-3E, fabrication of the memory cell of FIG. 2 will be described in detail with reference to cross sectional views along the line A-A'. FIGS. 3A-3E are drawn to show important features of the present invention and are not to scale. Common reference numerals are used for the same features. The memory cell is preferably formed on a P-type substrate 322. Silicon dioxide isolation regions 320 are preferably formed by standard local oxidation of silicon (LOCOS) as is well known to those having ordinary skill in the art. The silicon dioxide isolation regions 320 are preferably formed to a thickness of 5000 Å. The active region between isolation regions 320 is further oxidized to produce a gate oxide layer 310 of preferably of 300 Å. A photoresist mask 330 is formed by conventional photolithographic methods over the P-type substrate 322 and isolation regions 320. The substrate 322 then receives an N+ implant dose of preferably 1E15 atoms/cm$^2$ of arsenic (As) at 80 KeV implant energy. Alternatively, the N+ implant may be phosphorus (P) or a combination of arsenic and phosphorus. The N+ implant produces N+ impurity region 314 having a depth of preferably 800 Å below the surface of the gate oxide 310 or 500 Å below the surface of the P-type substrate 322 and having a peak concentration of 2E19 atoms/cm$^3$. Photoresist pattern 330 is then removed.

Figure 3A:
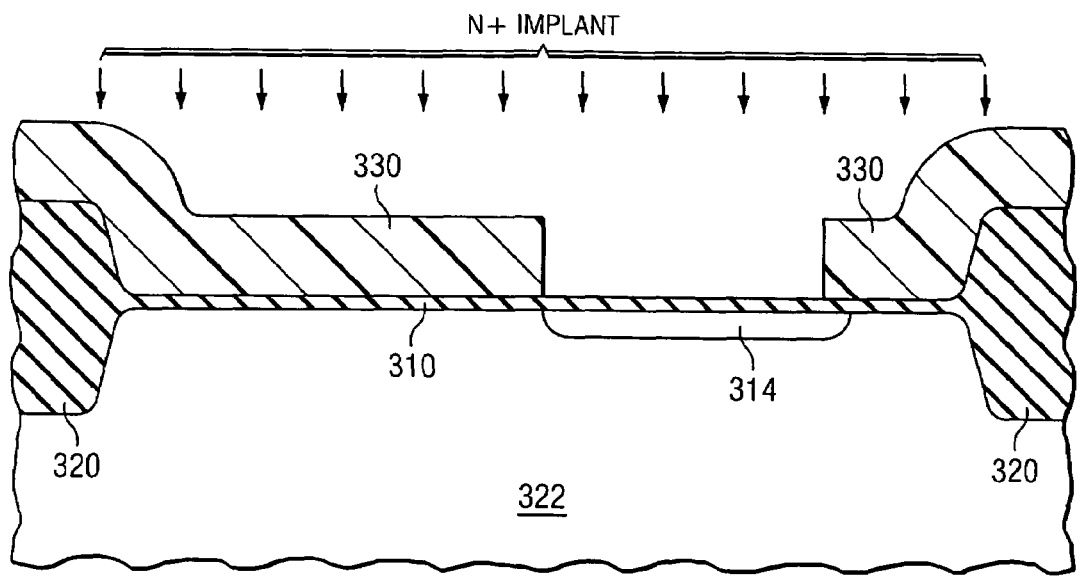
FIG. 3A is a cross sectional view along line A-A' of the memory cell of FIG. 2 at the tunnel implant manufacturing step.
Figure 3B:
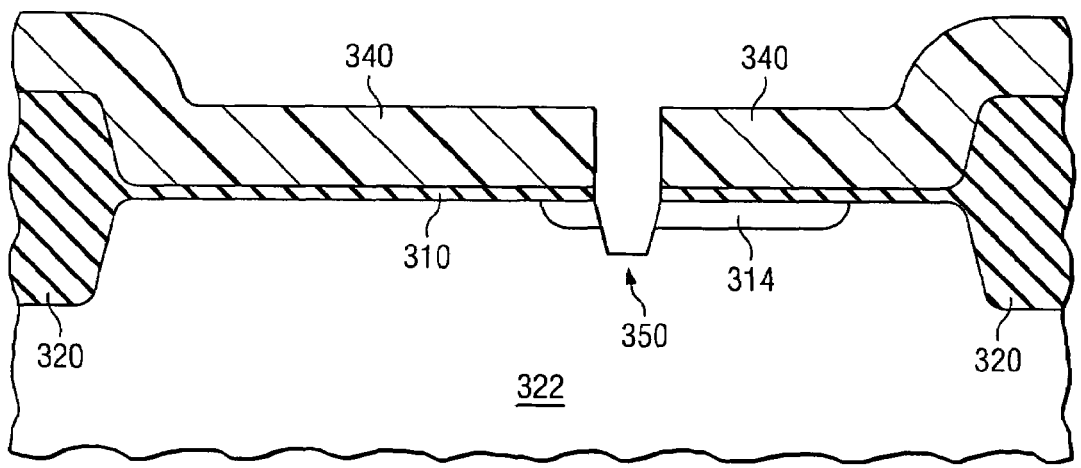
FIG. 3B is a cross sectional view along line A-A' of the memory cell of FIG. 2 at the tunnel window silicon etch manufacturing step.

Turning now to FIG. 3B, photoresist pattern 340 is then formed by conventional photolithographic methods over the P-type substrate 322, N+ region 314, and isolation regions 320. A hole 350 is then etched through gate oxide region 310 and preferably through N+ region 314 and into P-type substrate 322. The hole is preferably formed with sloping side walls but may alternatively be formed with vertical side walls. The photoresist pattern 340 is then removed.

Figure 3C:
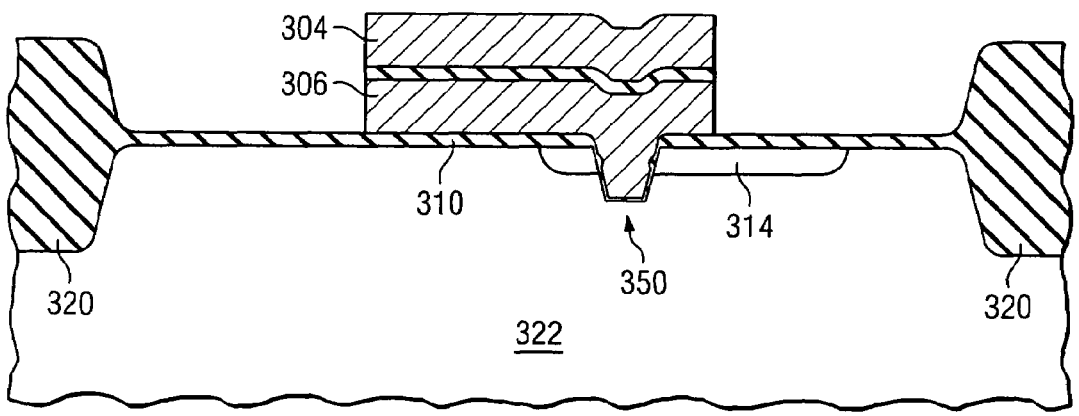
FIG. 3C is a cross sectional view along line A-A' of the memory cell of FIG. 2 after the first and second level polycrystalline silicon etch manufacturing step.

In FIG. 3C, a tunnel gate oxide is then grown on the side walls of hole 350. Some additional gate oxide 310 is grown at the surface of P-type substrate 322 and N+ region 314. A floating first polycrystalline silicon gate 306 is formed over the gate oxide region 310 and in the hole 350. Capacitance of the floating first polycrystalline silicon gate 306 with respect to P-type substrate 322 and N+ region 314 is approximately 2.7 fF. A second dielectric region is formed over the floating first polycrystalline silicon gate 306. This second dielectric region is preferably silicon dioxide. Alternatively, the second dielectric region may be a composite formed by consecutive layers of silicon dioxide, silicon nitride, and silicon dioxide (ONO). A second polycrystalline silicon control gate 304 is formed over and coincident with the floating first polycrystalline silicon gate 306. Capacitance of the second polycrystalline silicon control gate 304 with respect to the floating first polycrystalline silicon gate 306 is approximately 9.0 fF.

Figure 3D:
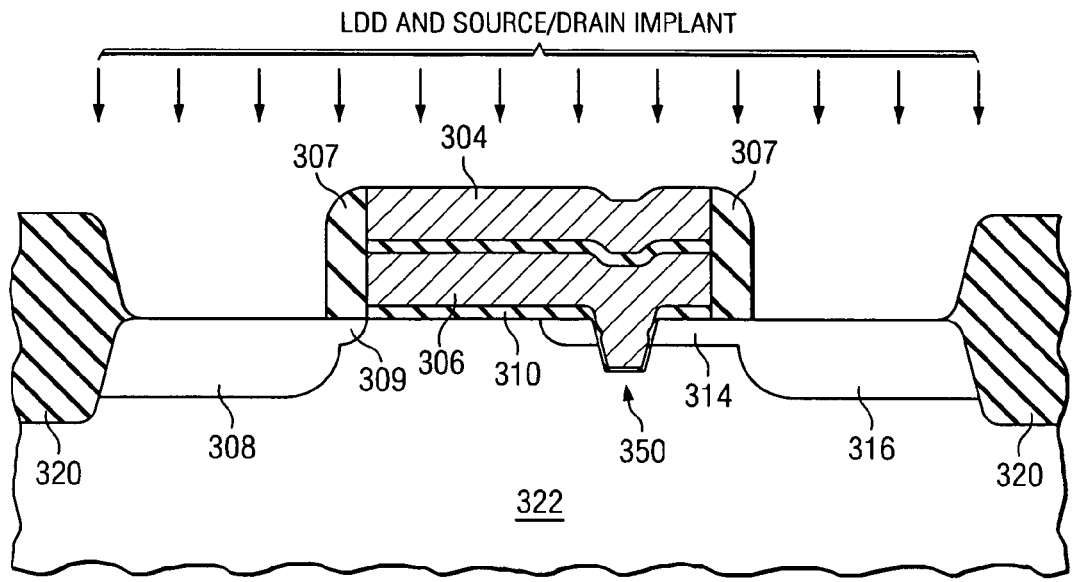
FIG. 3D is a cross sectional view along line A-A' of the memory cell of FIG. 2 at the N+ source and drain implant manufacturing step.
Figure 3E:
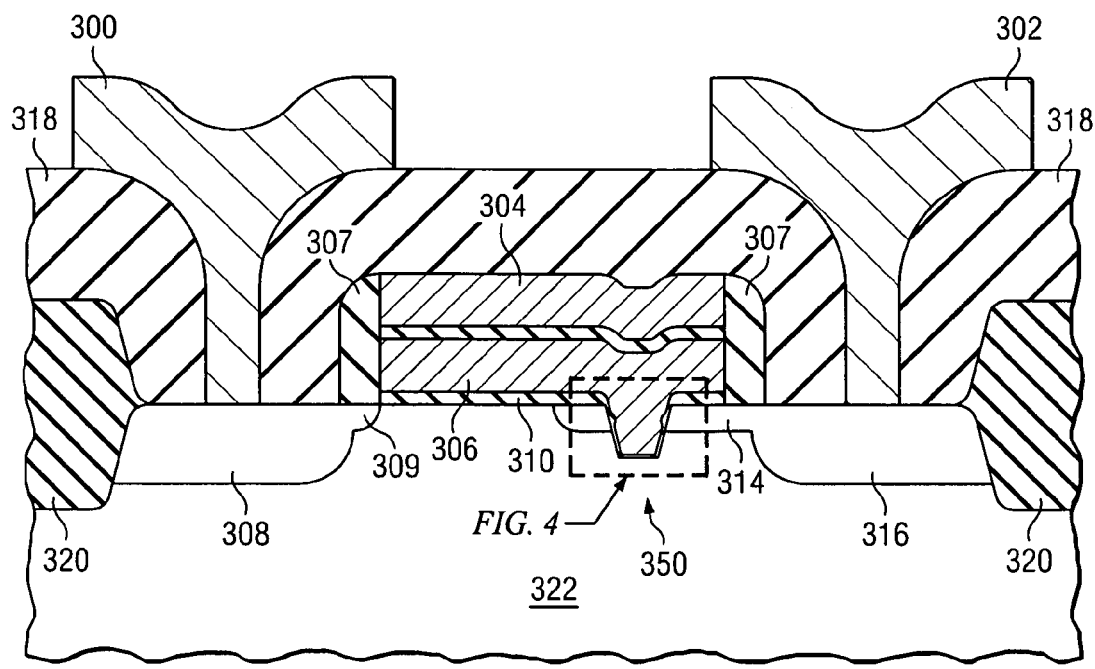
FIG. 3E is a cross sectional view along line A-A' of the memory cell of FIG. 2 after the metal pattern and etch manufacturing step.

Turning now to FIG. 3D, the memory cell then receives a lightly doped N+ implant 309. A dielectric layer of preferably silicon nitride is deposited by chemical vapor deposition (CVD). An anisotropic etch leaves sidewall dielectric spacers 307 adjacent the first polycrystalline silicon gate 306 and the second polycrystalline silicon control gate 304. Then an N+ source/drain is implanted with a dose of preferably 4E14 atoms/cm$^2$ of phosphorus (P) at 50 KeV implant energy and 3E15 atoms/cm$^2$ of arsenic (As) at 120 KeV implant energy. Alternatively, the N+ implant may be only arsenic (As) or only phosphorus (P). After a high temperature anneal, the N+ source 308 and drain 316 regions have a depth of preferably 3000 Å below the surface of the P-type substrate 322 and having a peak concentration of 1E21 atoms/cm$^3$. Titanium is deposited over the memory cell and annealed in a nitrogen ambient, thereby producing an upper layer of titanium nitride and a lower layer of titanium silicide. The titanium nitride is then removed, leaving titanium silicide (not shown) in conductive contact with the N+ source 308, drain 316, and control gate 304. Oxide region 318 is then deposited over the memory cell (FIG. 3E). Respective source 308, drain 316, and control gate 204 contact holes 200, 202, and 201 (FIG. 2) are etched in oxide layer 318. Metal source 300, drain 302, and control gate terminals are then formed over oxide layer 318 to provide electrical connection to the memory cell.

Figure 4:
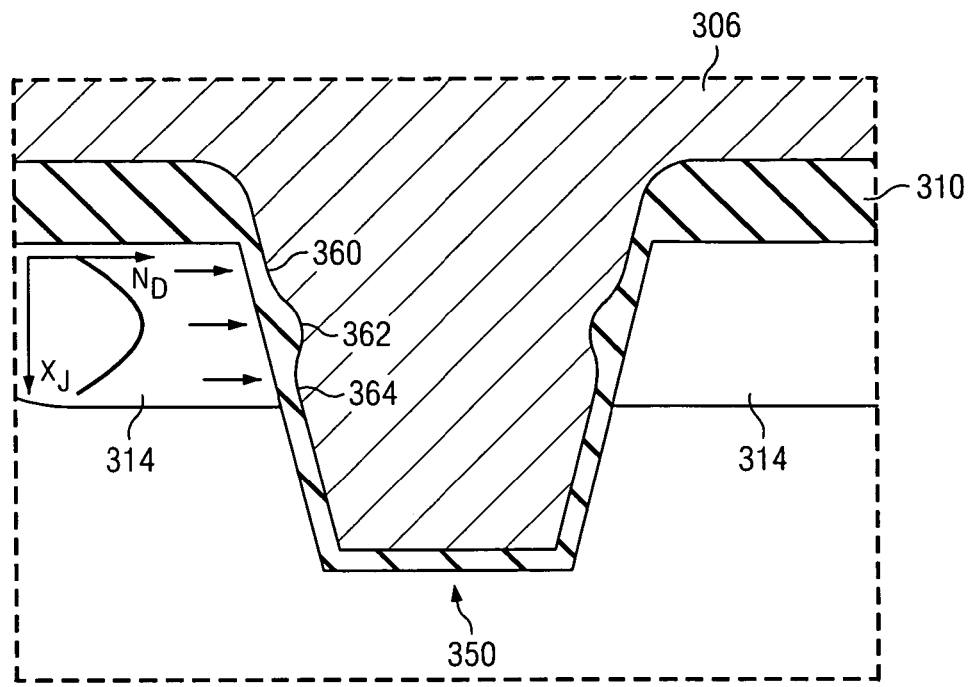
FIG. 4 is an enlarged view of the tunnel window silicon etch region of FIG. 3E.

Referring to FIG. 4, there is an enlarged cross sectional view of hole 350 of FIG. 3E. A diagram to the left of hole 350 shows the approximate doping profile of N+ region 314. Dimension $X_j$ is the distance from the surface of the P-type substrate. $N_D$ is the net donor concentration from the N+ implant and has a Gaussian distribution. As previously discussed, N+ region 314 greatly enhances growth of gate oxide layer 310 along the side walls of hole 350. Thus, gate oxide region 362, corresponding to a maximum net donor concentration is preferably 150 Å thick. By way of comparison, gate oxide regions 360 and 364, corresponding to a relatively lower net donor concentration, are preferably 70 Å thick. Enhanced oxidation, therefore, forms a variable gate oxide thickness corresponding to the doping profile of N+ region 314 along the side walls of hole 350. This variable gate oxide thickness 360-364 advantageously forms a self-selecting tunneling window for conducting charge between N+ region 314 and floating polycrystalline silicon gate 306.

Referring to FIGS. 3E and 4, in an erase operation drain region 316 and N+ region 314 are coupled to receive a high voltage of preferably 13V. Source region 308 is floating in a high impedance state. Control gate terminal 304 is at ground or 0V. Consequently, floating polycrystalline silicon gate 306 is capacitively coupled to a low voltage. This low voltage tends to deplete and may even invert low concentration regions 360 and 364 along the sidewall of hole 350 at the interface with N+ region 314. This depletion or inversion region acts as a voltage divider in series with the gate oxide layer, thereby reducing the electric field at regions 360 and 364. The corresponding decrease in electric field across the gate oxide layer at regions 360 and 364 inhibits negative charge flow from the floating polycrystalline silicon gate 306 to N+ region 314. The high N+ concentration at region 362 prevents depletion and inversion along the sidewall of hole 350 at the interface with N+ region 314. The gate oxide at region 362, however, is relatively thicker than at regions 360 and 364. The electric field across the gate oxide layer at region 362, therefore, is also less than optimal and inhibits negative charge flow from the floating polycrystalline silicon gate 306 to N+ region 314. Optimal values of N+ concentration and gate oxide thickness, however, must exist between region 362 and regions 360 and 364 due to the continuous variation of gate oxide thickness. Thus, a self-selecting current path will form between region 362 and regions 360 and 364 where the electric field reaches a local maximum value. Negative charge flows from the floating polycrystalline silicon gate 306 to N+ region 314 in response to this electric field, thereby producing an erase threshold voltage of −2.0V in the memory cell. This self-selecting current path advantageously provides a process tolerant erase threshold voltage over variations in gate oxide thickness 310 and N+ junction depth and concentration of region 314.

In a write or program operation drain region 316, N+ region 314, and source region 308 are coupled to ground or 0V. A high voltage of preferably 13V is applied to control gate terminal 304. Consequently, floating polycrystalline silicon gate 306 is capacitively coupled to a high voltage. This high voltage inverts the channel region between source 308 and N+ region 314 and the lower portion of hole 350. The high voltage of the floating polycrystalline silicon gate 306 also holds surfaces adjacent N+ region 314 in strong accumulation. Thus, a maximum electric field develops across gate oxide regions 360 and 364 at the sidewalls of hole 350. These regions 360 and 364 along the side walls of hole 350 serve as a current path for negative charge flow from N+ region 314 to floating polycrystalline silicon gate 306, thereby programming a one in the memory cell. Thus, a self-selecting current path will form at regions 360 and 364 where the electric field reaches a local maximum value. Negative charge flows from N+ region 314 to the floating polycrystalline silicon gate 306 to in response to this electric field, thereby producing a programmed threshold voltage of 5.0V in the memory cell. Moreover, this self-selecting current path is advantageously different from the current path of an erase operation. These different current paths for program and erase operations advantageously reduce cumulative charge flow through the tunneling oxide, thereby increasing the maximum permissible number of write and erase cycles over the life of the memory cell.

Figure 5:
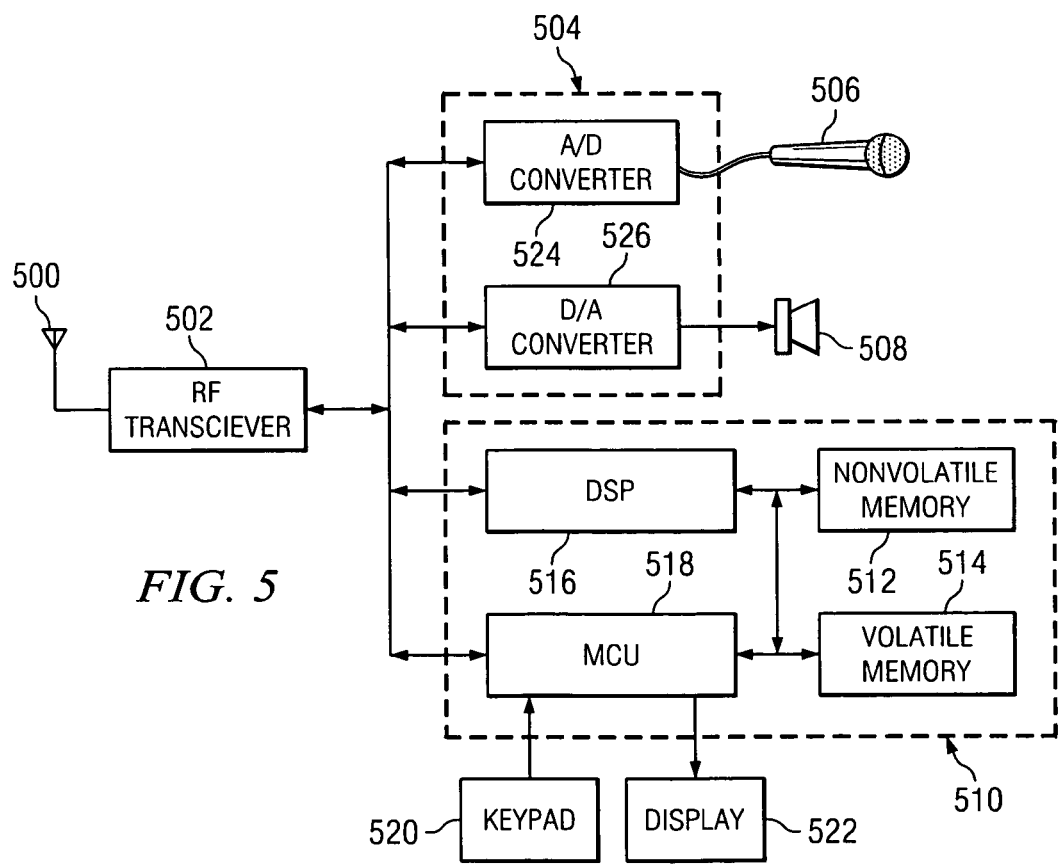
FIG. 5 is a block diagram of a wireless telephone as an example of a portable electronic device which could advantageously employ the present invention.

Referring to FIG. 5, there is a block diagram of a wireless telephone as an example of a portable electronic device which could advantageously employ this invention. The wireless telephone includes antenna 500, radio frequency transceiver 502, baseband circuits 510, microphone 506, speaker 508, keypad 520, and display 522. The wireless telephone is preferably powered by a rechargeable battery (not shown) as is well known in the art. Antenna 500 permits the wireless telephone to interact with the radio frequency environment for wireless telephony in a manner known in the art. Radio frequency transceiver 502 both transmits and receives radio frequency signals via antenna 502. The transmitted signals are modulated by the voice/data output signals received from baseband circuits 510. The received signals are demodulated and supplied to baseband circuits 510 as voice/data input signals. An analog section 504 includes an analog to digital converter 524 connected to microphone 506 to receive analog voice signals. The analog to digital converter 524 converts these analog voice signals to digital data and applies them to digital signal processor 516. Analog section 504 also includes a digital to analog converter 526 connected to speaker 508. Speaker 508 provides the voice output to the user. Digital section 510 is embodied in one or more integrated circuits and includes a microcontroller unit 518, a digital signal processor 516, nonvolatile memory circuit 512, and volatile memory circuit 514. Nonvolatile memory circuit 512 may include read only memory (ROM), electrically erasable programmable read only memory (EEPROM), ferroelectric memory (FeRAM), FLASH memory, or other nonvolatile memory as known in the art. Volatile memory circuit 514 may include dynamic random access memory (DRAM), static random access memory (SRAM), or other volatile memory circuits as known in the art. Microcontroller unit 518 interacts with keypad 520 to receive telephone number inputs and control inputs from the user. Microcontroller unit 518 supplies the drive function to display 522 to display numbers dialed, the current state of the telephone such as battery life remaining, and received alphanumeric messages. Digital signal processor 516 provides real time signal processing for transmit encoding, receive decoding, error detection and correction, echo cancellation, voice band filtering, etc. Both microcontroller unit 518 and digital signal processor 516 interface with nonvolatile memory circuit 512 for program instructions and user profile data. Microcontroller unit 518 and digital signal processor 516 also interface with volatile memory circuit 514 for signal processing, voice recognition processing, and other applications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, alternative doping profiles and impurity types are equally applicable to the present invention. In particular, the present invention may be applied to N-channel or P-channel EEPROMs. Furthermore, the present invention is particularly suitable for portable electronic devices such as wireless telephones, digital cameras, CDROM players, smart cards, or other portable applications. It is equally suitable for other nonvolatile memory applications in computers and automobiles. In view of the foregoing discussion, it is intended that the appended claims encompass any such modifications or embodiments.

What is claimed is:

1. A transistor formed on a substrate having a first conductivity type, comprising:
   a first impurity region having a second conductivity type formed at a face of the substrate;
   a second impurity region having the second conductivity type formed at the face of the substrate and spaced apart from the first region;
   a hole formed in the face of the substrate between the first and second impurity regions, a bottom surface of the hole having direct contact with the substrate having a first conductivity type;
   a first dielectric region formed over the hole and over the face of the substrate above a portion of the second impurity region; and
   a third impurity region having the second conductivity type formed at the face of the substrate, the third region adjacent the hole and in electrical contact with the second region;
   wherein the first dielectric region has a variable thickness along a sidewall of the hole, the variable thickness corresponding to a net donor concentration within the third impurity region.

2. A transistor as in claim 1, comprising:
   a first electrode formed over the first dielectric region.

3. A transistor as in claim 2, wherein the first electrode is a floating gate of a memory cell.

4. A transistor as in claim 2, comprising:
   a second dielectric region formed over the first electrode; and
   a second electrode formed over the second dielectric region.

5. A transistor as in claim 4, wherein the second electrode is a control gate of a memory cell.

6. A transistor as in claim 1, wherein the first and second impurity regions have a first depth from the face of the substrate and wherein the third impurity region has a second depth from the face of the substrate different from the first depth.

7. A transistor as in claim 6, wherein the first depth is greater than the second depth.

8. A transistor as in claim 6, wherein the hole has a third depth greater than the second depth and less than the first depth.

9. A portable electronic device, comprising:
   a processor; and
   an array of memory cells formed on a substrate having a first conductivity type and coupled to the processor, each memory cell of the array comprising:
   a first impurity region having a second conductivity type formed at a face of the substrate;
   a second impurity region having the second conductivity type formed at the face of the substrate and spaced apart from the first region; and
   a hole formed in the face of the substrate between the first and second impurity regions, a bottom surface of the hole having direct contact with the substrate having a first conductivity type;
   a first dielectric region formed over the hole and over the face of the substrate above a portion of the second impurity region;
   a third impurity region having the second conductivity type formed at the face of the substrate, the third region adjacent the hole and in electrical contact with the second region;
   wherein the first dielectric region has a variable thickness along a sidewall of the hole, the variable thickness corresponding to a net donor concentration within the third impurity region.

10. A portable electronic device, as in claim 9, wherein the processor is formed on the substrate.

11. A portable electronic device, as in claim 9, wherein the processor is a digital signal processor.

12. A portable electronic device, as in claim 9, wherein said each memory cell is a nonvolatile memory cell.

13. A portable electronic device, as in claim 11, wherein each nonvolatile memory cell is an electrically erasable programmable read only memory.

14. A portable electronic device as in claim 9, wherein the first and second impurity regions have a first depth from the face of the substrate and wherein the third impurity region has a second depth from the face of the substrate different from the first depth.

15. A portable electronic device as in claim 14, wherein the first depth is greater than the second depth.

16. A portable electronic device as in claim 14, wherein the hole has a third depth greater than the second depth and less than the first depth.

17. A transistor as in claim 1, wherein the variable thickness of the first dielectric region forms a self-selecting tunneling window at the sidewall of the hole.

18. A transistor as in claim 1, wherein during an erase operation a self-selecting current path forms between the thinnest and thickest portions of the first dielectric region along the sidewall of the hole.

19. A transistor as in claim 1, wherein during a write operation a self-selecting current path forms at the thinnest portions of the first dielectric region along the sidewall of the hole.

20. A portable electronic device as in claim 9, wherein the variable thickness of the first dielectric region forms a self-selecting tunneling window at the sidewall of the hole.

21. A portable electronic device as in claim 9, wherein during an erase operation a self-selecting current path forms between the thinnest and thickest portions of the first dielectric region along the sidewall of the hole.

22. A portable electronic device as in claim 9, wherein during a write operation a self-selecting current path forms at the thinnest portions of the first dielectric region along the sidewall of the hole.

* * * * *